(12) United States Patent
Blaum et al.

(10) Patent No.: US 8,910,012 B2
(45) Date of Patent: Dec. 9, 2014

(54) BLOCK-INTERLEAVED AND ERROR CORRECTION CODE (ECC)-ENCODED SUB DATA SET (SDS) FORMAT

(71) Applicant: International Business Machines Corporation, Armonk, NY (US)

(72) Inventors: Mario Blaum, San Jose, CA (US); Roy D. Cideciyan, Rueschlikon (CH); Robert A. Hutchins, Tucson, AZ (US); Thomas Mittelholzer, Zurich (CH)

(73) Assignee: International Business Machines Corporation, Armonk, NY (US)

(*) Notice: Subject to any disclaimer, the term of this patent is extended or adjusted under 35 U.S.C. 154(b) by 32 days.

(21) Appl. No.: 13/653,291

(22) Filed: Oct. 16, 2012

(65) Prior Publication Data

US 2014/0108881 A1 Apr. 17, 2014

(51) Int. Cl.
H03M 13/00 (2006.01)

(52) U.S. Cl.
USPC .......................................... 714/755; 714/756

(58) Field of Classification Search
CPC combination set(s) only.
See application file for complete search history.

(56) References Cited

U.S. PATENT DOCUMENTS

| | | | | |
|---|---|---|---|---|
| 5,299,208 A * | 3/1994 | Blaum et al. | ................... | 714/761 |
| 6,640,326 B1 * | 10/2003 | Buckingham et al. | ........ | 714/769 |
| 7,876,516 B2 * | 1/2011 | Cideciyan et al. | ............... | 360/40 |
| RE42,962 E * | 11/2011 | Yonemitsu et al. | ........... | 714/701 |
| 2001/0031134 A1 | 10/2001 | Uchida et al. | | |
| 2004/0088635 A1 * | 5/2004 | Kravtchenko | ................. | 714/758 |
| 2008/0031349 A1 * | 2/2008 | Lee et al. | .................. | 375/240.24 |
| 2008/0235556 A1 * | 9/2008 | Eleftheriou et al. | ........... | 714/755 |
| 2010/0177422 A1 * | 7/2010 | Cideciyan et al. | ............... | 360/40 |
| 2011/0110419 A1 * | 5/2011 | Lee et al. | .................... | 375/240.2 |
| 2012/0033321 A1 | 2/2012 | Cideciyan et al. | | |
| 2012/0036318 A1 | 2/2012 | Cideciyan et al. | | |

OTHER PUBLICATIONS

International Search Report and Written Opinion from PCT application No. PCT/CN2013/084892 dated Jan. 2, 2014.

* cited by examiner

*Primary Examiner* — Albert Decady
*Assistant Examiner* — Enamul M Kabir
(74) *Attorney, Agent, or Firm* — Zilka-Kotab, PC

(57) ABSTRACT

In one embodiment, a system for encoding data includes logic adapted for receiving data having one or more sub data sets, a C1 encoder module adapted for generating a plurality of C1 codewords during C1 ECC encoding of the one or more sub data sets, logic adapted for interleaving the plurality of C1 codewords into C1 codeword interleaves (CWIs), each CWI having a predetermined number of C1 codewords interleaved therein, a C2 encoder module adapted for generating a plurality of C2 codewords during C2 ECC encoding of the one or more sub data sets, wherein each C2 codeword has at most one symbol from each C1 codeword in each CWI, and wherein each C2 codeword has one symbol from at least two different C1 codewords in each CWI, and logic adapted for writing the one or more encoded sub data sets to a storage medium.

24 Claims, 10 Drawing Sheets

BLOCK-INTERLEAVED AND ERROR CORRECTION CODE (ECC)-ENCODED SUB DATA SET (SDS) FORMAT

BACKGROUND

The present invention relates to data storage, and more particularly, to storing data using a block-interleaved and error correction code (ECC)-encoded sub data set (SDS) format.

Tape and optical storage devices use very powerful error correction codes, such as product codes or concatenated codes, in conjunction with interleaving to provide a very high degree of data integrity. These error correction schemes typically use two ECCs as component codes. Two important burst-error performance measures for tape storage systems protected by these schemes are: 1) lateral width of an erroneous stripe which is still capable of being corrected (this is also known as "broken track correction" capability), and 2) longitudinal width of an erroneous stripe that is still capable of being corrected. A "broken" track generally refers to a track that cannot be read correctly due to a problem on the media itself and/or a problem with the readback channel, e.g., as a channel that does not detect data correctly because of some systematic problem with the head.

In the past, the error-correction power of these component codes was increased in order to increase the format efficiency of stored data, which is equivalent to decreasing storage overhead, and/or to improve the level of data integrity. However, these improvements were achieved by increasing the size of the overall codeword containing component code words, i.e., by increasing the size of the buffer that contains a data set, and more importantly, by weakening the broken-track correction capability. However, improvements in data integrity should not be achieved at the expense of a reduction in the capability to correct broken tracks along with an increase in buffer size.

Accordingly, it would be beneficial to have a data storage format that increases the format efficiency of stored data and/or improves the level of data integrity without increasing the size of the data set buffer and/or degrading the capability to correct broken tracks.

BRIEF SUMMARY

In one embodiment, a system for encoding data includes logic adapted for receiving data having one or more sub data sets, a C1 encoder module adapted for generating a plurality of C1 codewords during C1 ECC encoding of the one or more sub data sets, each of the C1 codewords having a plurality of symbols, logic adapted for interleaving the plurality of C1 codewords into C1 codeword interleaves (CWIs), each CWI having a predetermined number of C1 codewords interleaved therein, a C2 encoder module adapted for generating a plurality of C2 codewords during C2 ECC encoding of the one or more sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and logic adapted for writing the one or more encoded sub data sets to a storage medium.

In another embodiment, a system for decoding sub data sets includes logic adapted for receiving data having one or more encoded sub data sets, each encoded sub data set including CWIs, each CWI having a predetermined number of C1 codewords interleaved therein, a C1 decoder module adapted for decoding a plurality of C1 codewords from each of the CWIs, each of the C1 codewords having a plurality of symbols, a C2 decoder module adapted for decoding a plurality of C2 codewords from the one or more encoded sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and logic adapted for outputting the one or more decoded sub data sets.

According to another embodiment, a method for encoding sub data sets includes receiving data having one or more sub data sets, generating a plurality of C1 codewords during C1 ECC encoding of the one or more sub data sets, each of the C1 codewords having a plurality of symbols, interleaving the plurality of C1 codewords into CWIs, each CWI having a predetermined number of C1 codewords interleaved therein, generating a plurality of C2 codewords during C2 ECC encoding of the one or more sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and writing the one or more encoded sub data sets to a storage medium.

In yet another embodiment, a method for decoding sub data sets includes receiving data having one or more encoded sub data sets, each encoded sub data set including CWIs, each CWI having a predetermined number of C1 codewords interleaved therein, decoding a plurality of C1 codewords from each of the CWIs, each of the C1 codewords having a plurality of symbols, decoding a plurality of C2 codewords from the one or more encoded sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and outputting the one or more decoded sub data sets.

Other aspects and embodiments of the present invention will become apparent from the following detailed description, which, when taken in conjunction with the drawings, illustrates by way of example the principles of the invention.

DETAILED DESCRIPTION

Figure 1:
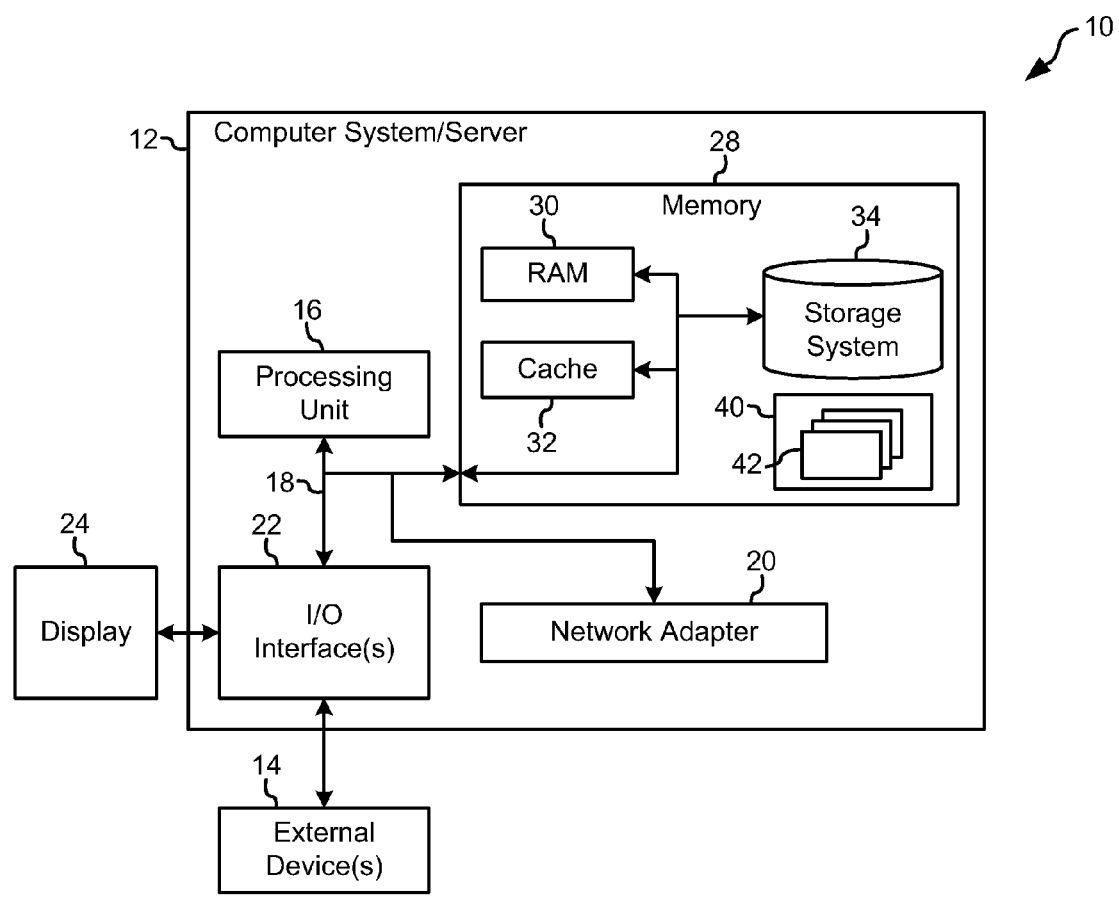
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

The error correction code (ECC)-encoded sub data set (SDS) structure may be made more robust to errors by using longer component codes (longer C1 and/or C2 codes with increased error correction capability) and an improved block-interleaving scheme while maintaining the data set size and the broken track and stripe error performance of conventional ECC schemes.

In one general embodiment, a system for encoding data includes logic adapted for receiving data having one or more sub data sets, a C1 encoder module adapted for generating a plurality of C1 codewords during C1 ECC encoding of the one or more sub data sets, each of the C1 codewords having a plurality of symbols, logic adapted for interleaving the plurality of C1 codewords into C1 codeword interleaves (CWIs), each CWI having a predetermined number of C1 codewords interleaved therein, a C2 encoder module adapted for generating a plurality of C2 codewords during C2 ECC encoding of the one or more sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and logic adapted for writing the one or more encoded sub data sets to a storage medium.

In another general embodiment, a system for decoding sub data sets includes logic adapted for receiving data having one or more encoded sub data sets, each encoded sub data set including CWIs, each CWI having a predetermined number of C1 codewords interleaved therein, a C1 decoder module adapted for decoding a plurality of C1 codewords from each of the CWIs, each of the C1 codewords having a plurality of symbols, a C2 decoder module adapted for decoding a plurality of C2 codewords from the one or more encoded sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and logic adapted for outputting the one or more decoded sub data sets.

According to another general embodiment, a method for encoding sub data sets includes receiving data having one or more sub data sets, generating a plurality of C1 codewords during C1 ECC encoding of the one or more sub data sets, each of the C1 codewords having a plurality of symbols, interleaving the plurality of C1 codewords into CWIs, each CWI having a predetermined number of C1 codewords interleaved therein, generating a plurality of C2 codewords during C2 ECC encoding of the one or more sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and writing the one or more encoded sub data sets to a storage medium.

In yet another general embodiment, a method for decoding sub data sets includes receiving data having one or more encoded sub data sets, each encoded sub data set including CWIs, each CWI having a predetermined number of C1 codewords interleaved therein, decoding a plurality of C1 codewords from each of the CWIs, each of the C1 codewords having a plurality of symbols, decoding a plurality of C2 codewords from the one or more encoded sub data sets, each of the C2 codewords having a plurality of symbols, wherein each C2 codeword has at most one symbol from each C1 codeword in each CWI, and wherein each C2 codeword has one symbol from at least two different C1 codewords in each CWI, and outputting the one or more decoded sub data sets.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
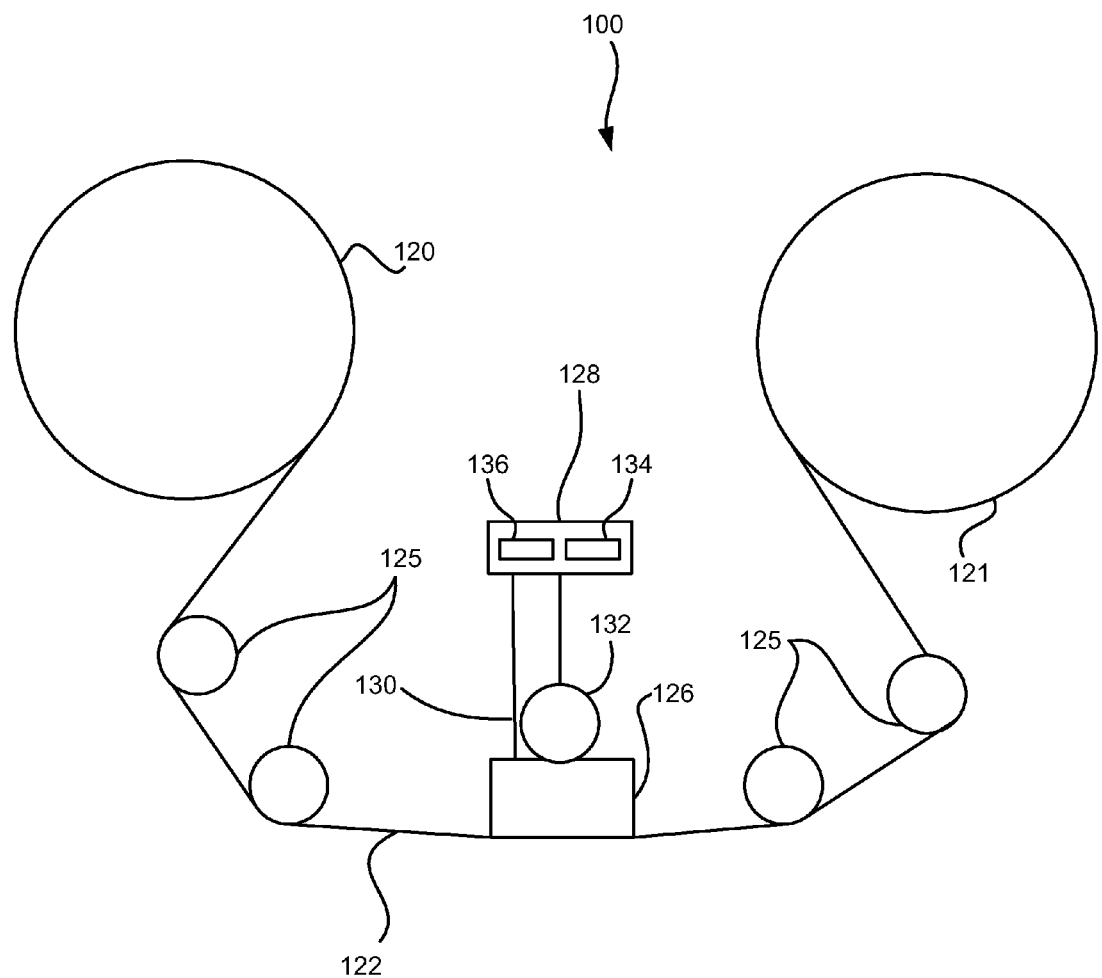
FIG. 2 illustrates a simplified tape drive of a tape-based data storage system, according to one embodiment.

FIG. 2 illustrates a simplified tape drive 100 of a tape-based data storage system, which may be employed according to various embodiments. While one specific implementation of a tape drive is shown in FIG. 2, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

ECC is used in data storage to achieve very low bit error rates, e.g., magnetic tape and optical storage products are designed to ensure bit error rates in the range of $1\times10^{-17}$ to $1\times10^{-19}$ under normal operating conditions. Linear block codes, such as Reed-Solomon (RS) codes and low-density parity-check (LDPC) codes, have generally been preferred ECC schemes used in data storage products.

Conventionally, RS encoders at a transmitter (a write side in the context of data storage) take a number of information symbols (K) at an input of the encoder, where each symbol consists of a number of bits (m), with a preferred choice for the size of m being eight, e.g., in one embodiment, m=8, with the symbols being bytes. The RS encoder then generates, in a first step, a number of N−K symbols, which are known as "parity symbols," "overhead," or "redundancy," as a linear function of the K input symbols and appends, in a second step, the generated (N−K) parity symbols at an end of the K information symbols to obtain an N-symbol RS codeword where N>K. Note that for typical RS codes, $N<2^m$, whereas for extended RS codes, $N=2^m$ or $N=2^m+1$. Therefore, in general, $N<2^m+2$.

This is referred to as generating code words from a RS(N, K) code. The Hamming distance (d) of a RS(N,K) code is d=N−K+1. This means that any two RS(N,K) code words differ by d or more symbols, where there are a total of $(2^m)^K$ RS(N,K) code words. RS(N,K) codes may also be referred to as RS(N,K,d) codes, thereby including the indication of the Hamming distance in the notation. The m-bit symbols of an RS code are from a Galois field (GF) with $2^m$ symbols. Therefore, RS codes may also be referred to as RS(N,K,d) codes over $GF(2^m)$. The RS parity symbols may be generated using a linear feedback shift register circuit, or some other technique known in the art. A RS encoder which appends generated parity symbols to the information symbols is known in the art as a "systematic encoder."

A RS decoder for a RS(N,K,d) code over $GF(2^m)$ at a receiver (a read side in the context of data storage) is capable of correcting t symbols, where t=floor((N−K)/2). In other words, up to t symbols in an N-symbol RS code word may be corrupted and the RS decoder is still capable of correcting these t erroneous m-bit symbols, where each erroneous m-bit symbol contains at least 1 bit error and at most m bit errors. This RS decoder has an error correction capability of t. Sometimes, the RS decoder may use additional information about locations of erroneous symbols within a code word. In other words, the RS decoder is aware of which symbols are in error but does not know how many bits, nor which bits in the erroneous symbols are wrong. This is the case for erasure correction. The RS decoder is capable of correcting up to e erased symbols, where e=(N−K). In this case, the RS decoder is aware of locations of the erroneous symbols. In general, the RS decoder is capable of correcting e' erased symbols and t' erroneous symbols with unknown locations when (e'+2t')<d, where d=(N−K+1).

If there are t=floor((N−K)/2) or less erroneous symbols (or e=(N−K) or less erased symbols) in a RS code word (in the most general case: (e'+2t')<d=(N−K+1)), a bounded-distance RS decoder (in practice, most RS decoders are of a bounded-distance type) corrects all erroneous symbols and erased symbols. If there are more than t erroneous symbols (or more than e erased symbols) in a RS code word (in the most general case: (e'+2t')>(N−K)), two things may occur at the output of the bounded-distance RS decoder.

The most likely occurrence is that the RS decoder raises a decoding failure flag which indicates that the total number of erroneous symbols and erased symbols exceeds the error correction capability of the RS decoder. In a less likely outcome, the total number of erroneous symbols and erased symbols may cause the receiver's corrupted RS code word to become very close to another RS code word and the RS decoder may correct the errors and the erased symbols and output an erroneous RS code word. In this case, a "miscorrection" occurred and the RS decoder is not aware that a mistake was made. The most likely miscorrection case is when the decoded RS code word differs in d=N−K+1 symbols from the original RS code word. Finally, the RS decoder drops the parity symbols from the decoded RS code word to recover the information symbols.

Figure 3:
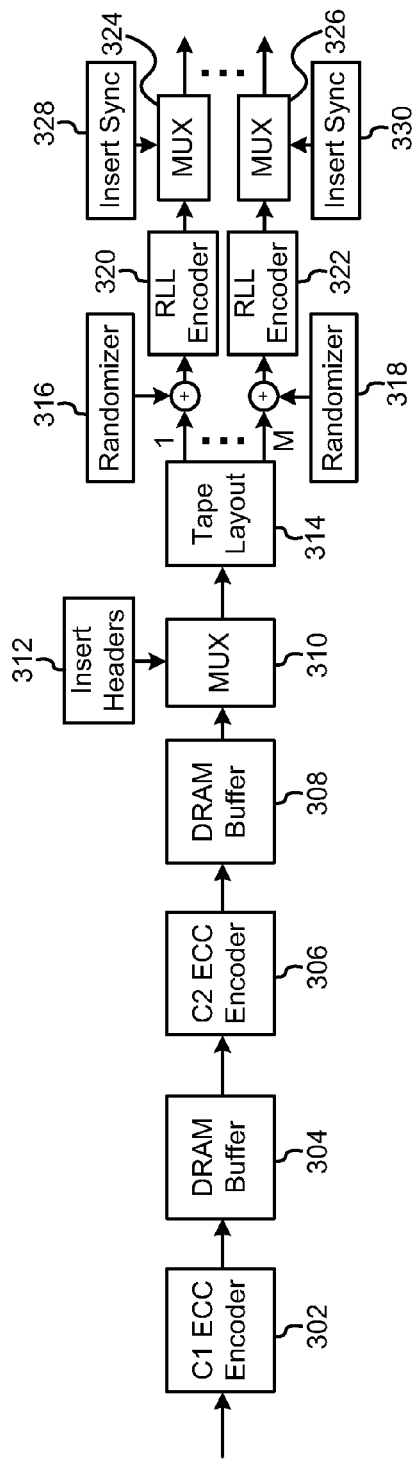
FIG. 3 shows a system for encoding data, according to one embodiment.

Now referring to FIG. 3, a system 300 for encoding data in a tape drive with K simultaneously written tracks is shown, including the operations of a C1 error correction code (ECC) encoder module 302, a DRAM buffer 304, C2 ECC encoder module 306, a second DRAM buffer 308 (which may be the same or different from DRAM buffer 304), a multiplexer 310 for adding one or more headers 312 to encoded data, and tape layout addition module 314, according to one embodiment. The system 300 also includes scrambling (e.g., randomizers 1 to M adapted for data randomization in each channel) 316, . . . , 318, run-length limited (RLL) encoder modules 320, . . . , 322, individual channel multiplexers 324, . . . , 326 for inserting synchronization 328, . . . , 330 for each track 1, . . . , M. Any number of tracks may be written to a magnetic medium, such as 4 tracks, 8 tracks, 16 tracks, 32 tracks, 64 tracks, etc. Furthermore, any type of storage medium may be used, such as magnetic tape, optical disk (such as CD-ROM, DVD-ROM, Blu-Ray, etc.), hard disk, etc.

In one approach, the storage medium may be a magnetic tape, and the system 300 may comprise logic adapted for parsing the encoded data into a plurality of tracks prior to writing the encoded data to the magnetic tape, such as the tape layout addition module 314, in one embodiment.

In FIG. 3, the C1 ECC encoder module 302, the DRAM buffer 304, the C2 ECC encoder module 306, and the second DRAM buffer 308 may be used for inserting a product code into sub data sets (SDS).

In the following descriptions, most of these operations are not shown to simplify description as the C1 parity and C2 parity in the ECC encoding are the focus of the descriptions. However, any of the descriptions herein may include additional operations not depicted, but described in other figures.

Figure 4:
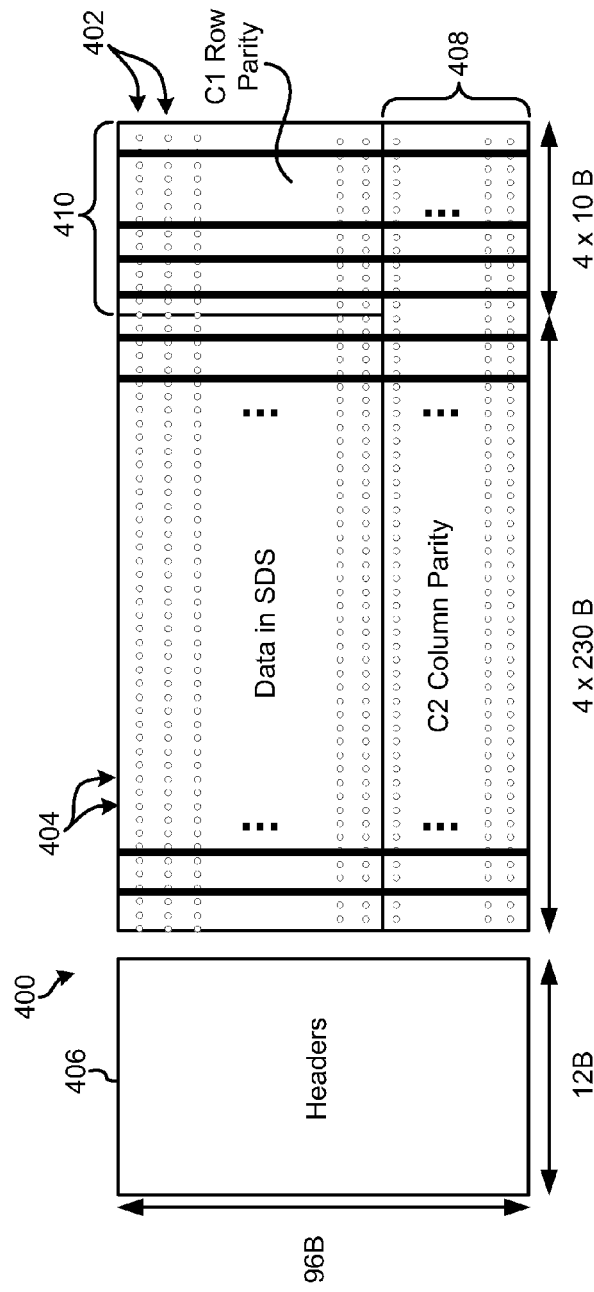
FIG. 4 shows an encoded sub data set (SDS) unit, according to one embodiment.

Each data set in the received data which is processed according to any embodiment described herein includes multiple subunits or sub data sets (SDS) and as shown in FIG. 4, each SDS is a two-dimensional array 400 with rows 402 and columns 404, according to various embodiments. Each row 402 in the array 400 comprises one or more C1 codewords, while each column 404 in the array 400 comprises a portion of a C2 codeword, one C2 codeword, or more than one C2 codeword, according to various embodiments. The rows 402 (along with any header 406 present in each row 402) are written to data tracks as packets. In Linear Tape Open (LTO), each encoded-SDS includes two (for generations LTO1-LTO4) or four (LTO5) C1 codewords in the rows 402. However, anywhere from one to eight or more C1 codewords may be included in each row 402 of the SDS array 400. Usually, hundreds of headers 406 are assigned to a single data set because each data set includes multiple SDS and each row 402 of a column-encoded SDS is assigned a header 406, which results in a headerized SDS array 400

In a preferred embodiment, a column 404 of a SDS two-dimensional array 400 comprises one half of a C2 codeword, where each row 402 of the SDS array 400 comprises one CWI.

As shown in FIG. 4, since the C1 encoding takes place prior to the C2 ECC encoding, the C2 column parity 408 extends along the entire length of each row 402 in the C2 column parity portion of the array 400. The C1 row parity 410 is positioned at the end of each row 402 outside of the C2 column parity 408 portion of the SDS array 400.

According to one embodiment, where each row 402 may include four C1 codewords interleaved into the entirety of the row 402, referred to as a CWI-4. Each C1 codeword may be 230 bytes long, with the additional C1 parity adding an additional 10 bytes. Since four C1 codewords are interleaved in each row 402 in this embodiment, each row 402 (a row is one CWI-4) has 4×230 bytes+4×10 bytes=960 bytes. Furthermore, in this embodiment, there may be 96 rows 402 in each headerized SDS array 400, or more or less rows 402 in other embodiments.

In addition, the headers 406, in one approach, may be 12 bytes long, with 96 rows 402 of headers 406 being present in this embodiment. This results in a total size of a headerized SDS two-dimensional array 400 being 93,312 bytes, with no ECC encoding for the headers 406.

Furthermore, in one approach, the C1 ECC encoding scheme may comprise a RS(240,230,11) code over GF(256), and the C2 ECC may comprise a RS(96,84,13) code over GF(256).

Referring now to FIGS. 3-4, in one embodiment, a system 300 for encoding data may comprise logic adapted for receiving data comprising one or more SDS, a C1 ECC encoder module 302 adapted for generating a plurality of C1 codewords during C1 ECC encoding of the one or more SDS, each of the C1 codewords comprising a plurality of symbols. In some embodiments, the symbols may be bytes (eight bits where each bit is 0 or 1), although other symbols may be used in other embodiments. The system 300 may also include logic adapted for interleaving the plurality of C1 codewords into C1 codeword interleaves (CWIs), such as the multiplexer 310. Each CWI has a predetermined number of C1 codewords interleaved therein, and as shown in FIG. 4, there are four C1 codewords interleaved in each row (CWI-4) 402, but any number of codewords may be interleaved, such as two, six, eight, ten, etc.

In order to interleave C1 codewords into each row 402, what happens is that a first symbol, with preferred choice for a symbol being a byte consisting of eight bits, of each codeword is placed in the row, followed by the second symbol of each codeword, followed by the third symbol of each codeword, and each subsequent symbol from each codeword interleaved together so that all codewords' first symbols are together, all second symbols, all third symbols, . . . , and then all last symbols of each of the codewords. In one embodiment, the positioning of the interleaves is different across different rows 402 in the array 400 so that the symbols from the first interleave are not always in a column 404 together.

In other words, the logic adapted for interleaving the plurality of C1 codewords into the CWIs 402 comprises logic adapted for byte-interleaving a same number of C1 codewords together into each CWI 402. The number of C1 codewords interleaved together may range from two to eight C1 codewords or more.

The tape layout interleaves C2 and C1 codewords and thus decorrelates byte errors at the C2 decoder input. In one approach, a 6 MB data set (DS) may include 64 SDS which are the basic ECC data units. The tape layout also associates headers to SDS rows (~1 kB packet) and assigns each packet to one of the logical tracks, e.g., to one of 32 logical tracks. An error rate of less than $1\times10^{-3}$ at the C2 decoder input translates to an error rate of less than $1\times10^{-17}$ at the C2 decoder output. A 32-track tape layout with good decorrelation properties may be designed such that LTO-5 minimum packet spacing is increased by about 50%, in one approach.

The system 300 also includes a C2 encoder module 306 adapted for generating a plurality of C2 codewords during C2 ECC encoding of the one or more SDS, each of the C2 codewords comprising a plurality of symbols. The C2 codewords are represented by columns 404 in the array 400, with each column 404 including a portion of one, exactly one, or more C2 codewords, according to various embodiments. However, in this embodiment, each C2 codeword has at most one symbol from each C1 codeword in each CWI (each row 402), and each C2 codeword has one symbol from at least two different C1 codewords in each CWI (e.g., two different interleaves from the same row 402).

Also, the system 300 comprises logic adapted for writing the one or more encoded SDS to the storage medium. This logic may be included in the tape layout addition module 314, RLL encoders 320, 322, and multiplexers 324, 326, in one approach.

In system 300, the C1 ECC encoding is performed prior to the C2 ECC encoding, which results in SDS encoding as shown in FIG. 4, according to one embodiment.

Figure 5:
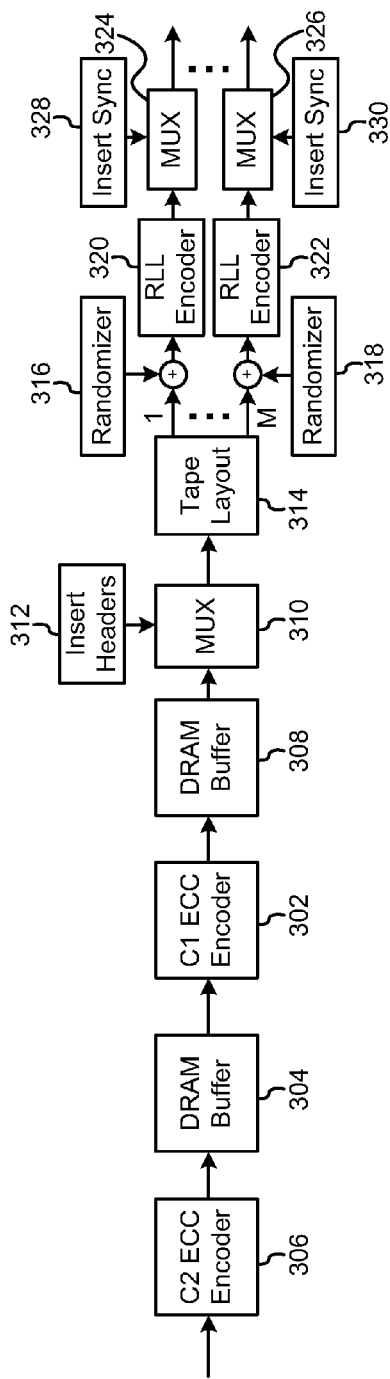
FIG. 5 shows a system for encoding data, according to one embodiment.
Figure 6:
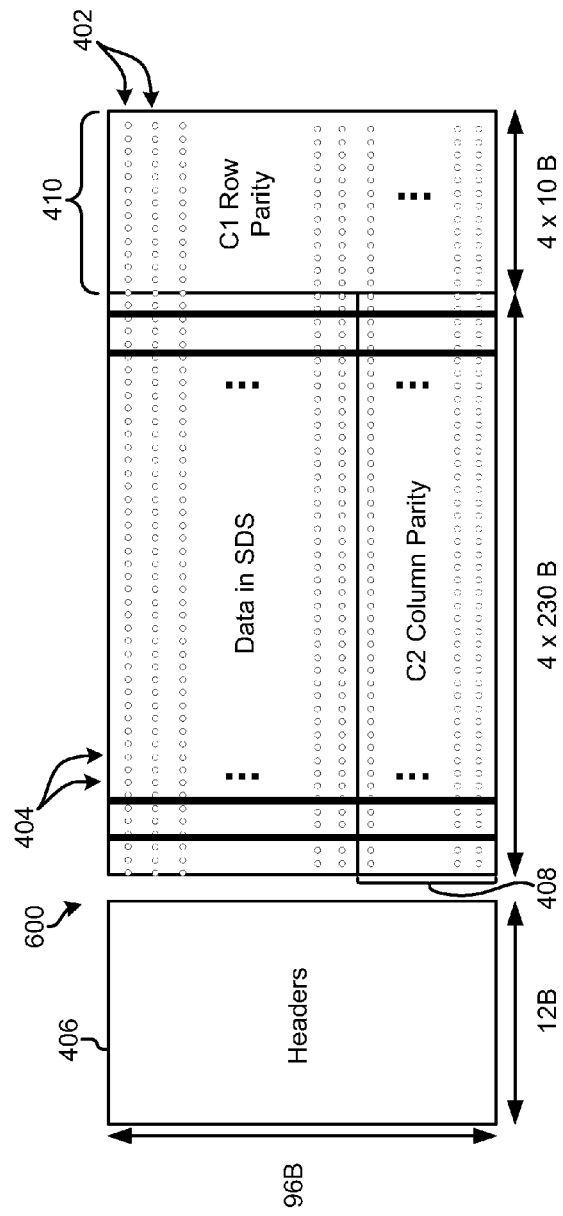
FIG. 6 shows an encoded SDS unit, according to one embodiment.

According to another embodiment, as shown in FIGS. 5-6, a system 500 may have the C2 ECC encoding (using the C2 ECC encoder module 306) performed prior to the C1 ECC encoding (using the C1 ECC encoder module 302), which results in SDS encoding as shown in FIG. 6, according to one embodiment.

As can be seen from the SDS two-dimensional array 600 generated by this encoding scheme, the C2 column parity does not extend across the length of the array 600, as the C1 row parity extends across all rows in the array 600 since this encoding is performed after the C2 encoding. However, just as in array 400 in FIG. 4, array 600 in FIG. 600 has headers 406 that are not encoded.

In this embodiment, it is possible to also have a C2 encoder module 306 adapted for generating a plurality of C2 codewords during C2 ECC encoding of the one or more SDS. The C2 codewords are represented by columns 404 in the array 600, with each column 404 including a portion of one, exactly one, or more C2 codewords, according to various embodiments. However, in this embodiment, each C2 codeword has at most one symbol from each C1 codeword in each CWI (each row 402), and each C2 codeword has one symbol from at least two different C1 codewords in each CWI (e.g., two different interleaves from the same row 402).

Furthermore, in one approach, the C1 ECC encoding scheme may comprise a RS(240,230,11) code over GF(256), and the C2 ECC may comprise a RS(96,84,13) code over GF(256).

Figure 7:
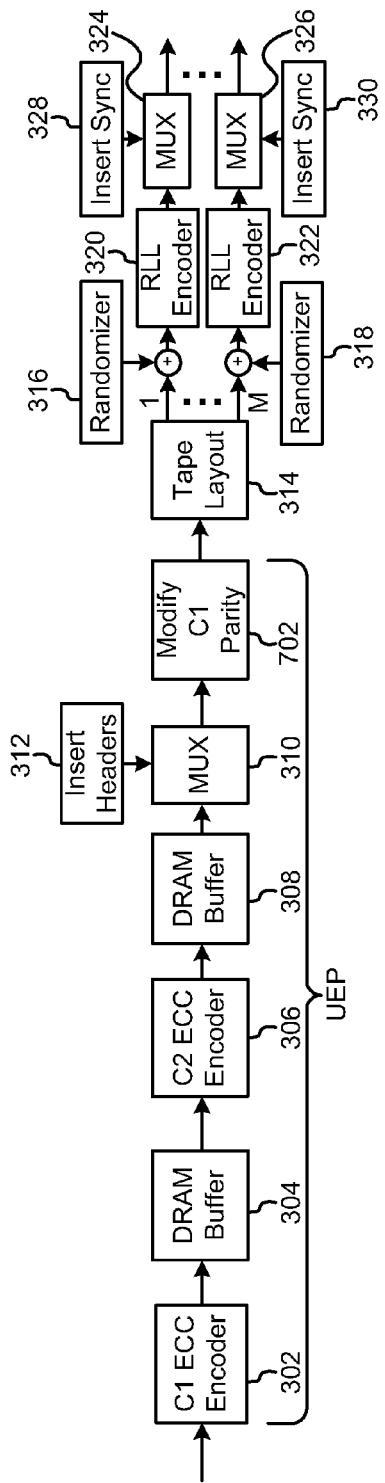
FIG. 7 shows a system for encoding data, according to one embodiment.
Figure 8:
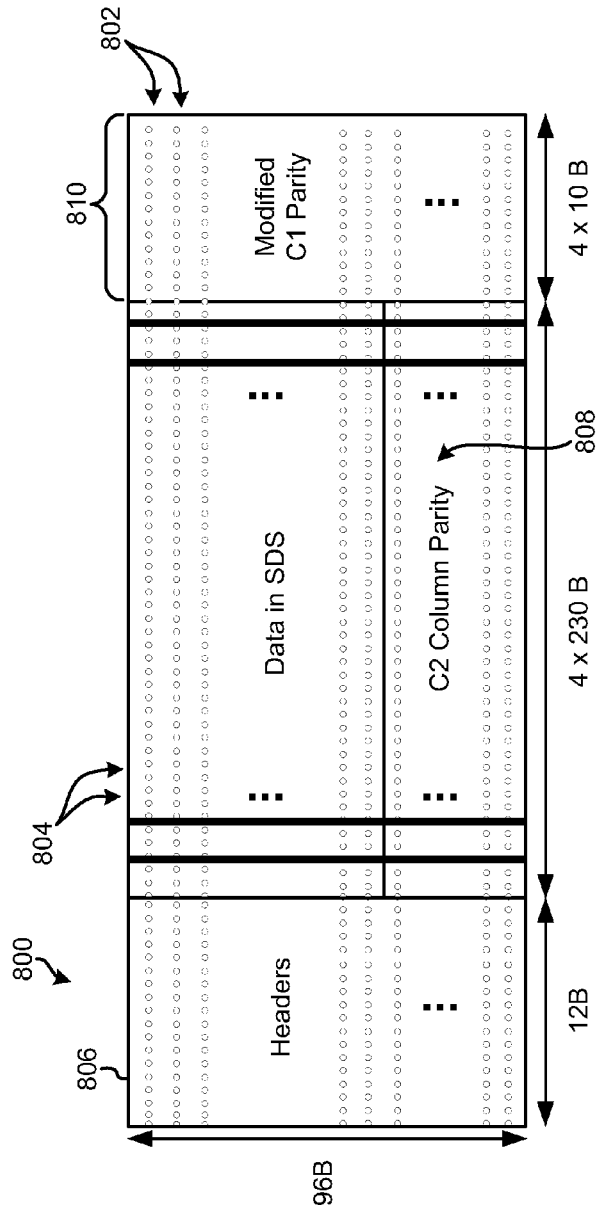
FIG. 8 shows an encoded SDS unit, according to one embodiment.

According to another embodiment, as shown in FIGS. 7-8, a system 700 may include all modules and logic that is present in FIG. 3, described previously. However, in the embodiment shown in FIGS. 7-8, the headers 806 may be encoded using a C1 encoding scheme by modifying the C1 parity to account for the headers 806 using a C1 parity modifying module 702. This may be referred to as a concatenated code with unequal error protection (UEP). In this embodiment, the headers 806 are protected by one-level ECC whereas the data is protected by two-level ECC.

In other words, the system 700 may also include logic adapted for adding one or more headers 806 to each of the one or more SDS, and logic adapted for modifying the plurality of C1 codewords to account for inclusion of the headers 806. Typically, a number of headers 806 added equals a number of rows 802 (which equals a number of CWIs) in the array 800.

In this embodiment, the C2 column parity 808 does not extend across the entirety of the array 800, even though the C2 column parity 808 is created after the C1 row parity. This is because the C1 row parity is modified using the module 702 to account for the headers 806, such that it overwrites any C2 column parity 808 (or C1 row parity) that exists at the end of each row 802 (the last 40 bytes of each row 802). Furthermore, each header 806 is included in the C1 codewords, which adds 12 bytes to each of the CWI. When four codewords are included in each row 802, 3 bytes are added to each of the C1 codewords. The modify C1 parity unit 702 modifies the C1 row parity and a portion of the C2 column parity 808 which is below the modified C1 parity 810 (the last 4×10 bytes at the end of each row in C2 column parity 808 in this embodiment) in order to ensure that each row 802 in the array 800 is a CWI comprising interleaved C1 codewords.

However, just as in the previous embodiments, each C2 codeword has at most one symbol from each C1 codeword in each CWI (each row 802), and each C2 codeword has one symbol from at least two different C1 codewords in each CWI (e.g., two different interleaves from the same row 802).

Figure 9:
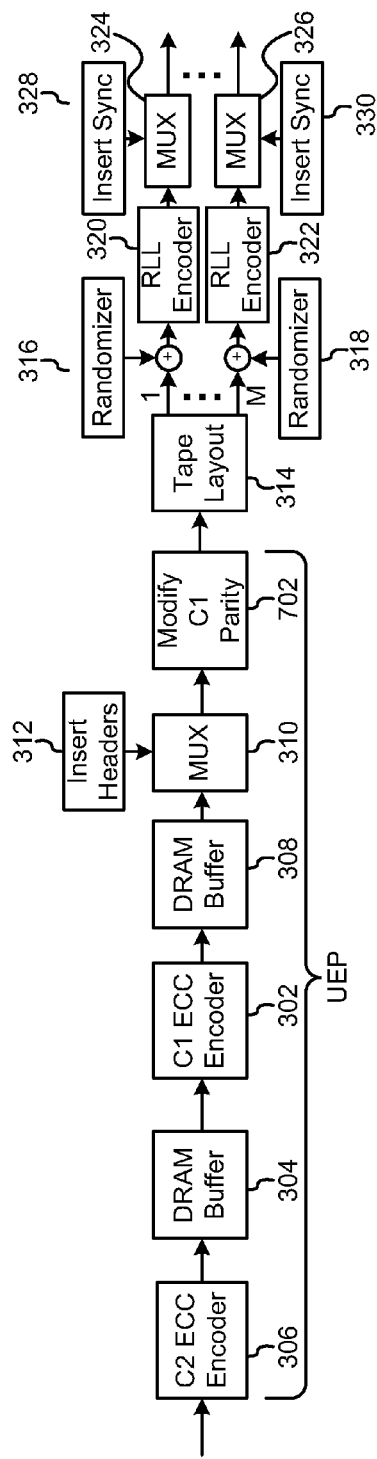
FIG. 9 shows a system for encoding data, according to one embodiment.
Figure 10:
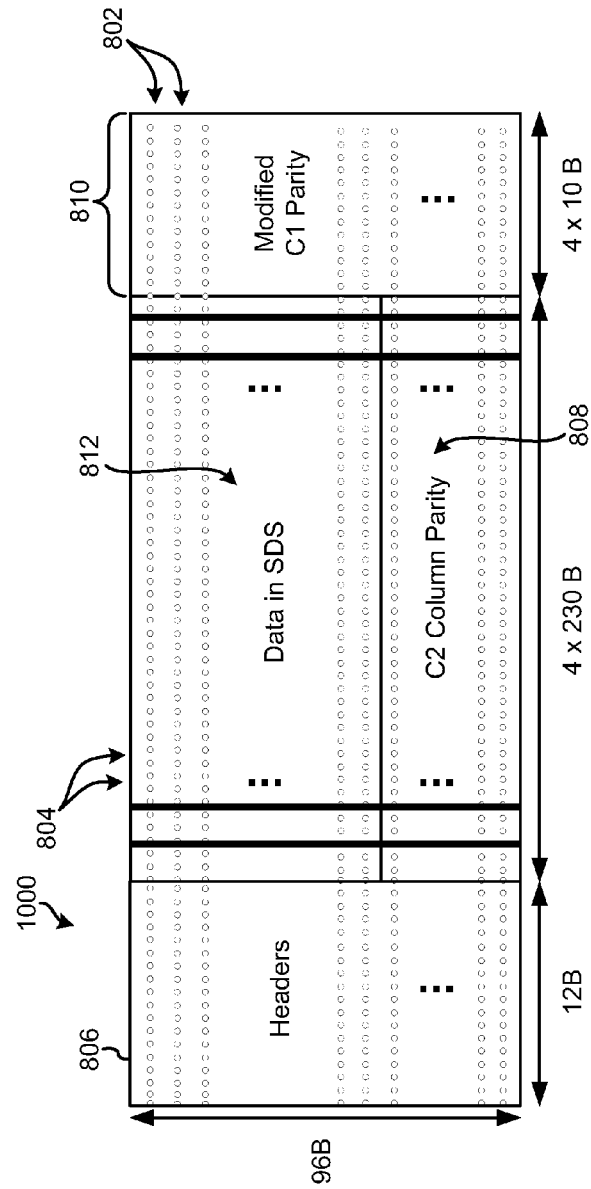
FIG. 10 shows an encoded SDS unit, according to one embodiment.

Now referring to FIGS. 9-10, a system 900 may include all modules and logic that is present in FIG. 5, described previously. However, in the embodiment shown in FIGS. 9-10, the headers 806 may be encoded using a C1 encoding scheme by modifying the C1 row parity to account for the headers 806 using a C1 parity modifying module 702. This may be referred to as a concatenated code with UEP. In this embodiment, the headers 806 are protected by one-level ECC whereas the data is protected by two-level ECC.

In other words, the system 900 may also include logic adapted for adding one or more headers 806 to each of the one or more SDS, and logic adapted for modifying the plurality of C1 codewords to account for inclusion of the headers 806. Typically, a number of headers 806 added equals a number of rows 802 (which equals a number of CWIs) in the array 1000.

In this embodiment, the C2 column parity 808 does not extend across the entirety of the array 1000, as the C2 column parity 808 generated prior to C1 encoding exists only in columns 804 of the array 1000 that are beside the last few rows 802 of the modified C1 parity 810. In addition, the C1 row parity is modified to account for the headers 806 using module 702, such that it overwrites any C1 row parity or C2 column parity 808 that exists at the end of each row 802 (the last 40 bytes of each row 802) to produce modified C1 parity 810. Furthermore, each header 806 is included in the C1 codewords, which adds 12 bytes to each of the CWI. When four codewords are included in each row 802, 3 bytes are added to each of the C1 codewords. The modify C1 parity unit 702 modifies the C1 row parity in order to ensure that each row 802 in the array 1000 is a CWI comprising interleaved C1 codewords.

In other words, C2 column parity 808 is created first, then C1 row parity, and then the C1 row parity is overwritten by the modified C1 parity 810 to make sure that headers 806 are embedded (or protected) by C1 codewords. In the rows 802 that include Data in SDS 812, the modified C1 parity 810 depends on the header 806 and data in SDS 812, whereas in the rows 802 that include C2 column parity 808, the modified C1 parity 810 depends on the header 806 and C2 column parity 808.

However, just as in the previous embodiments, each C2 codeword has at most one symbol from each C1 codeword in each CWI (each row 802), and each C2 codeword has one symbol from at least two different C1 codewords in each CWI (e.g., two different interleaves from the same row 802).

Figure 11:
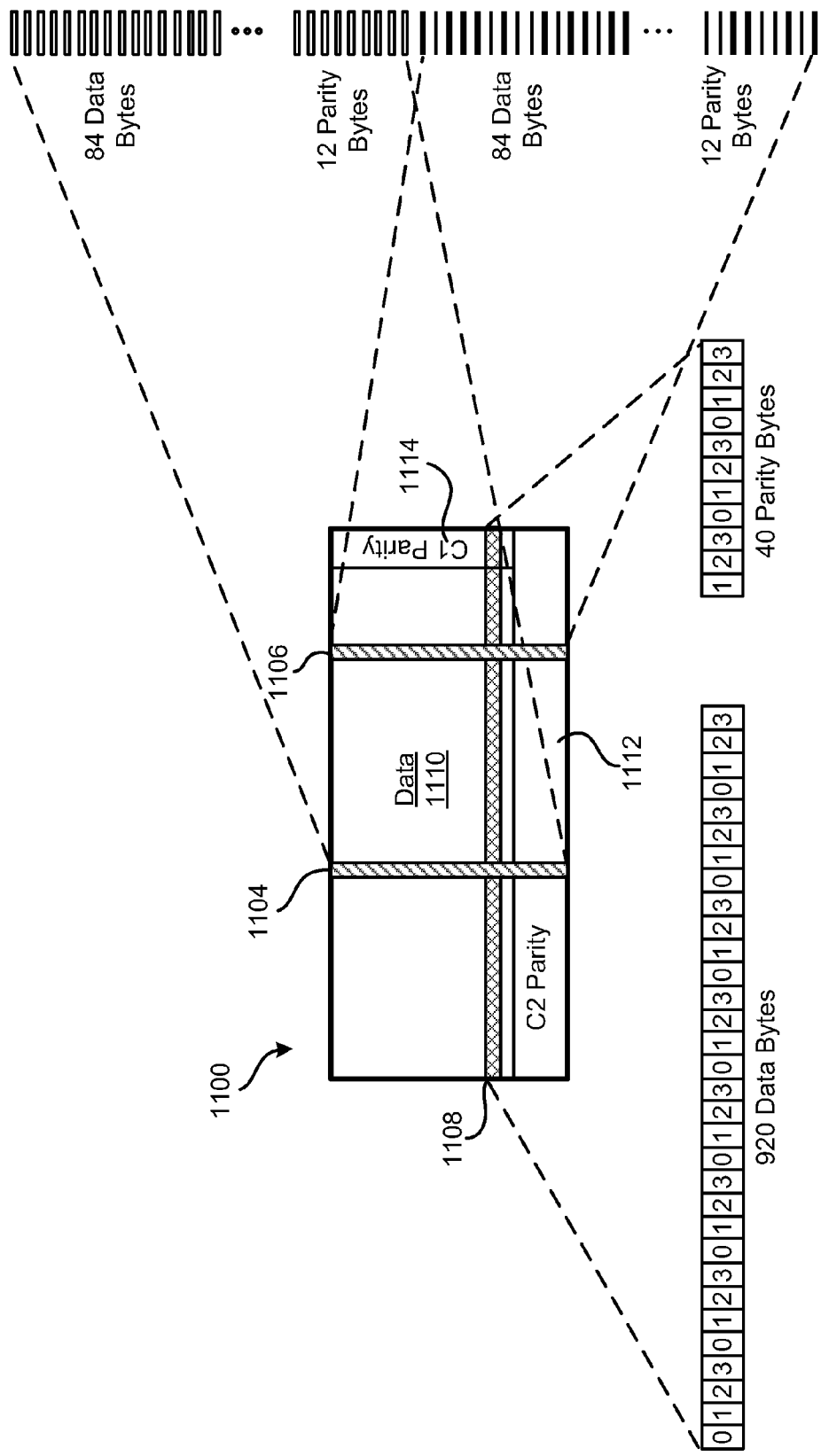
FIG. 11 shows an encoded SDS unit, according to one embodiment.

Now referring to FIG. 11, a block-interleaved SDS format is described in more detail, according to various embodiments. A single SDS is shown in a two-dimensional array 1100, with a data portion 1110, a C2 parity portion 1112, and a C1 parity portion 1114. As an example, the block-interleaved C1/C2-encoded SDS is presented as a 96×960 array, which may be based on a concatenated C1/C2 code. Of course, any sized array may be used, which may be based on memory size constraints for a specific implementation, or according to some other criteria. The row 1108, in this example, includes four interleaved (N=240, K=230, d=11)-RS-codewords over GF(256). The pairs of columns 1104, 1106 are (N=192, K=168, d=25)-RS codewords over GF(256). Furthermore, the pairs of columns 1104, 1106 include components from different C1-interleaves (indicated as 0, 1, 2, or 3 in the row detailed view) and may be chosen such that in each pair of columns 1104, 1106, the two columns are maximally spaced. In this way, each column will include a symbol from a different C1 interleave.

Figure 12:
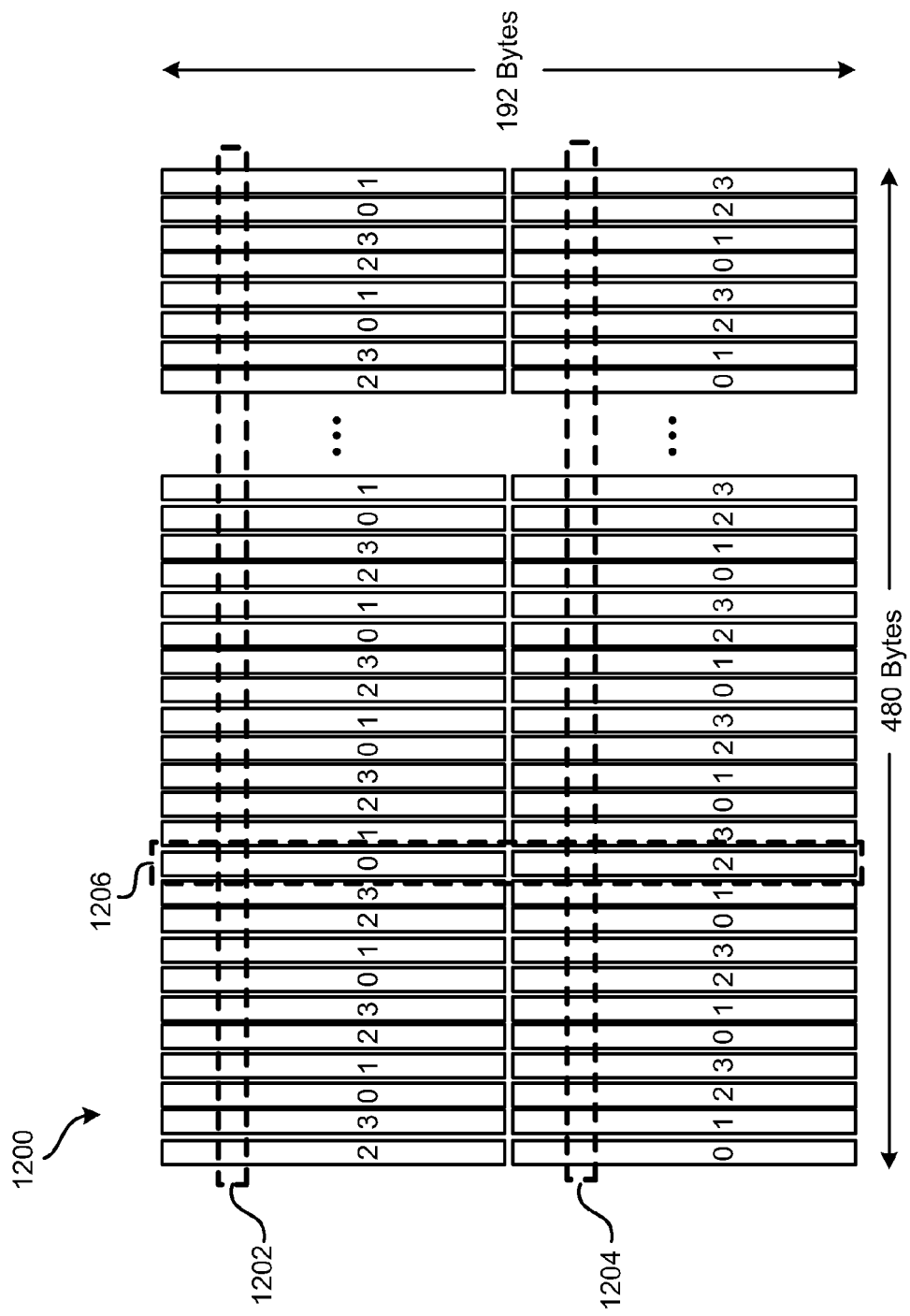
FIG. 12 shows an encoded SDS unit, according to one embodiment.

Now referring to FIG. 12, an alternate block-interleaved C1/C2-encoded SDS format is shown, as an example. In this embodiment, the SDS is represented as a 192×480 array 1200. In this embodiment, the pairs of rows 1202, 1204 include four interleaved (N=240, K=230, d=11)-RS-codewords over GF(256), while the pairs of rows 1202, 1204 are chosen to be at a distance of 96 bytes within the 192×480 array for maximal distance. Furthermore, the column 1206 includes (N=192, K=168, d=25)-RS codewords over GF(256) with 12 parity bytes in the first length-96 codeword segment and 12 parity bytes in the second length-96 codeword segment.

As these two examples of arrays show, there are multiple different ways for a C1/C2-encoded SDS to be stored while still adhering to the additional protections described herein. Specifically, each C2 codeword has at most one symbol from each C1 codeword in each interleaved C1 codeword set, while each C2 codeword also has one symbol from at least two different C1 codewords in each interleaved C1 codeword set.

In another example, assume SDS rows consist of 4 byte-interleaved C1 codewords. All SDS rows belonging to a particular SDS are written as far apart as possible in a written data set on tape. Assume the C2 code is over GF(256), i.e., RS code symbols are bytes. Then, consider two cases: 1) prior-art: C2 code is RS(96,84) over GF(256) w/ error correction capability t=6 where every column of SDS is a C2 codeword; and 2) block-interleaved SDS: C2 code is RS(192,168) over GF(256) w/ error correction capability t=12 where two columns of SDS is a C2 codeword. Now consider two extreme error scenarios for both cases. In an optimistic scenario, each corrupted SDS row in an SDS contains one uncorrectable C1 codeword where all C1 uncorrectable errors within an SDS are in the same interleave. In a pessimistic scenario, each corrupted SDS row in an SDS contains four uncorrectable C1 codewords.

In the pessimistic scenario, if x SDS rows in an SDS are corrupted, there are x erased bytes in 96-byte C2 codeword in case 1, whereas there are 2x erased bytes in 192-byte C2 code word in case 2. As the error correction capability t=12 of RS(192,168) is twice as large as t=6 of RS(96,84), the error performances of case 1 and case 2 are the same under these worst-case circumstances.

In the optimistic scenario, if x SDS rows in an SDS are corrupted, there are x erased bytes in 96-byte C2 code word in case 1, whereas there are also x erased bytes in 192-byte C2 code word in case 2. As the error correction capability t=12 of RS(192,168) is twice as large as t=6 of RS(96,84), the error performance of case 2 is significantly better than that of case 2 under these best-case circumstances.

Figure 13:
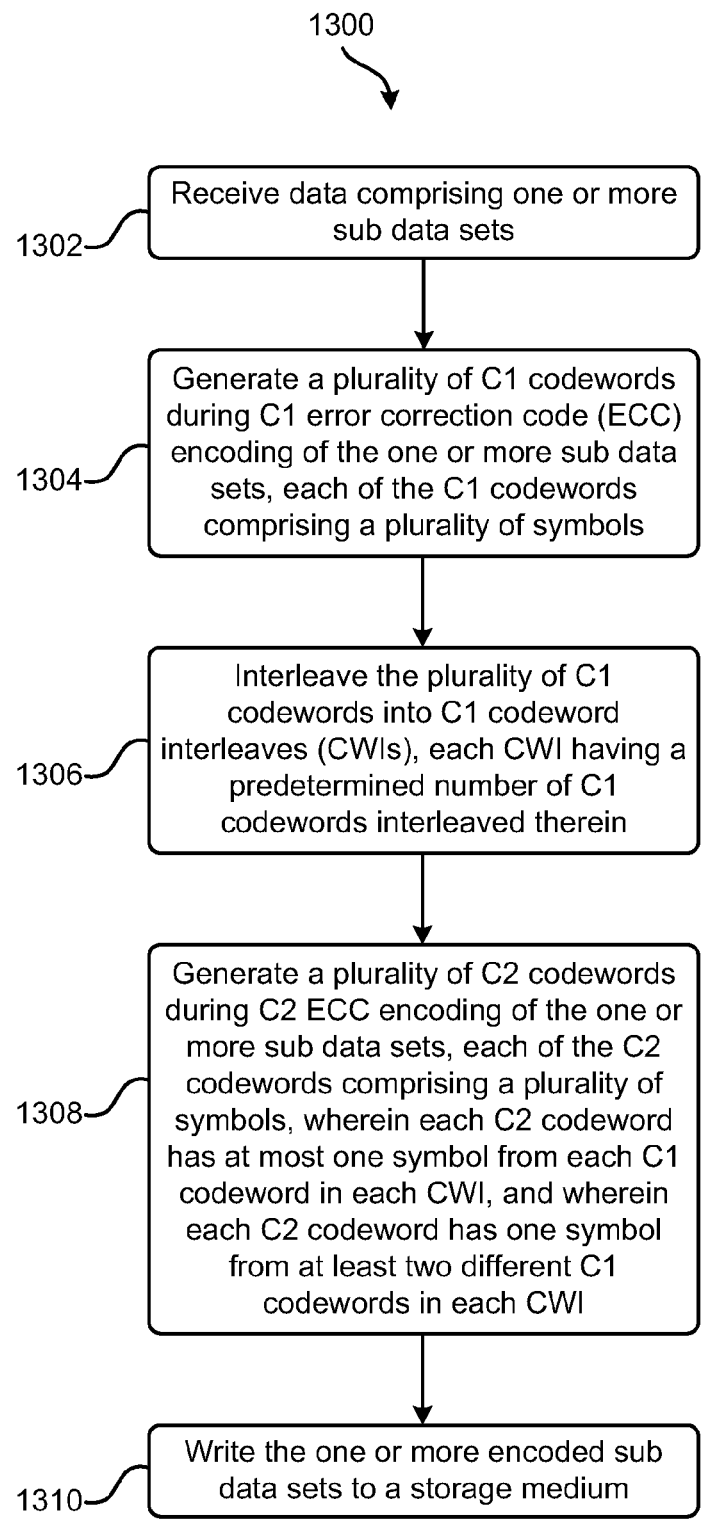
FIG. 13 is a flowchart of a method, according to one embodiment.

Now referring to FIG. 13, a method 1300 for encoding SDS is shown according to one embodiment. The method 1300 may be performed in accordance with the present invention in any of the environments depicted in FIGS. 1-12, among others, in various embodiments. Of course, more or less operations than those specifically described in FIG. 13 may be included in method 1300, as would be understood by one of skill in the art upon reading the present descriptions.

Each of the steps of the method 1300 may be performed by any suitable component of the operating environment. For example, in various non-limiting embodiments, the method 1300 may be partially or entirely performed by a C1/C2 encoding system, a tape drive, a hard disk drive, an optical drive, a processor (such as a CPU, an ASIC, a FPGA, etc.) which may be embedded in and/or operate within a system, etc.

As shown in FIG. 13, method 1300 may initiate with operation 1302, where data comprising one or more sub data sets is received. This data may be read from a medium, received from some other system or device, transferred or obtained in any other way known in the art. The data includes one or more data sets, each data set including one or more sub data set (SDS).

In operation 1304, a plurality of C1 codewords are generated during C1 ECC encoding of the one or more sub data sets, each of the C1 codewords comprising a plurality of symbols. In a preferred embodiment, each symbol is a byte, e.g., eight bits where each bit is 0 or 1.

In operation 1306, the plurality of C1 codewords are interleaved into C1 codeword interleaves (CWIs), each CWI having a predetermined number of C1 codewords interleaved therein. In one embodiment, each CWI has four C1 codewords interleaved therein, referred to as a CWI-4.

In operation 1308, a plurality of C2 codewords are generated during C2 ECC encoding of the one or more sub data sets. Each of the C2 codewords comprises a plurality of symbols, with each C2 codeword having at most one symbol from each C1 codeword in each CWI. Also, each C2 codeword has one symbol from at least two different C1 codewords in each CWI.

In operation 1310, the one or more encoded sub data sets are written to a storage medium, such as a magnetic tape, hard disk, optical disk, etc.

According to one embodiment, the method 1300 may further comprise adding a header to each of the one or more sub data sets. In more embodiments, the plurality of C1 codewords may be modified to account for inclusion of the headers, such as by using a concatenated code with UEP.

In one embodiment, C2 ECC encoding may be performed prior to C1 ECC encoding. In an alternate embodiment, C1 ECC encoding may be performed prior to C2 ECC encoding.

In additional approaches, the interleaving of the plurality of C1 codewords into the CWIs may comprise byte-interleaving a same number of C1 codewords together into each CWI, the number possibly being from two to eight C1 codewords.

In another approach, the storage medium may be a magnetic tape, and method 1300 may further comprise parsing the encoded data into a plurality of tracks prior to writing the encoded data to the magnetic tape. This may be performed using a tape layout known in the art.

In another embodiment, the C1 ECC may comprise a RS(240,230,11) code over GF(256), and the C2 ECC may comprise a RS(192,168,25) code over GF(256).

Figure 14:
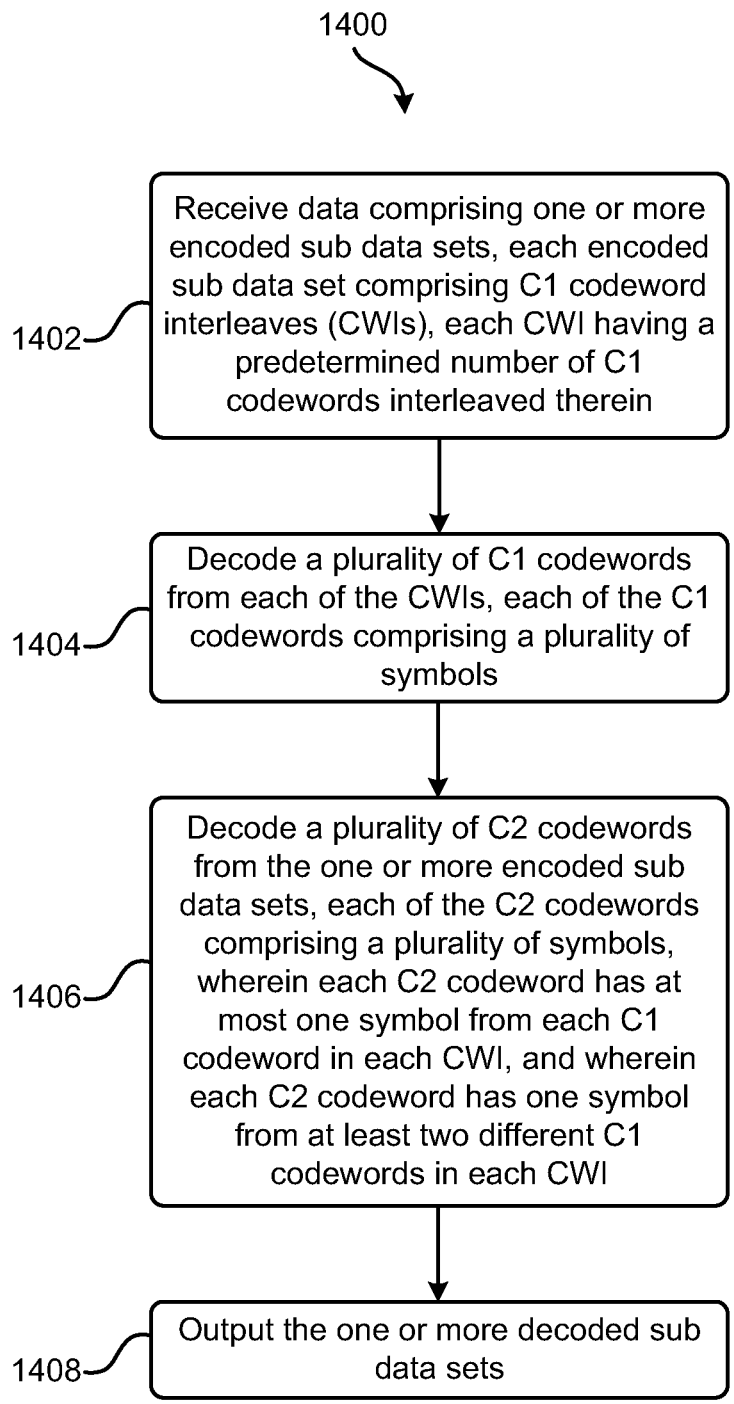
FIG. 14 is a flowchart of a method, according to one embodiment.

Now referring to FIG. 14, a method 1400 for decoding SDS is shown according to one embodiment. The method 1400 may be performed in accordance with the present invention in any of the environments depicted in FIGS. 1-12, among others, in various embodiments. Of course, more or less operations than those specifically described in FIG. 14 may be included in method 1400, as would be understood by one of skill in the art upon reading the present descriptions.

Each of the steps of the method 1400 may be performed by any suitable component of the operating environment. For example, in various non-limiting embodiments, the method 1400 may be partially or entirely performed by a C1/C2 decoding system, a tape drive, a hard disk drive, an optical drive, a processor (such as a CPU, an ASIC, a FPGA, etc.) which may be embedded in and/or operate within a system, etc.

As shown in FIG. 14, method 1400 may initiate with operation 1402, where data comprising one or more encoded SDS are received, each encoded SDS comprising C1 CWIs. Each CWI has a predetermined number of C1 codewords interleaved therein.

In operation 1404, a plurality of C1 codewords are decoded from each of the CWIs, with each of the C1 codewords comprising a plurality of symbols. Any decoding technique known in the art may be used. In some embodiments, a C1 ECC comprising a RS(240,230,11) code over GF(256) may be decoded.

In operation 1406, a plurality of C2 codewords from the one or more encoded SDS may be decoded, each of the C2 codewords comprising a plurality of symbols. Each C2 codeword has at most one symbol from each C1 codeword in each CWI, and each C2 codeword has one symbol from at least two different C1 codewords in each CWI. According to one embodiment, a C2 ECC comprising a RS(192,168,25) code over GF(256) may be decoded.

In operation 1408, the one or more decoded SDS is output, such as by saving, sending, transferring, printing, providing, or otherwise rendering the one or more decoded SDS to another system.

In some embodiments, a header may be decoded from each of the one or more encoded SDS, such as by decoding a concatenated code with UEP.

In another approach, the decoding of the plurality of C2 codewords may be performed prior to the decoding of the plurality of C1 codewords. In an alternate approach, the decoding of the plurality of C1 codewords may be performed prior to the decoding of the plurality of C2 codewords.

In one embodiment, each CWI may comprise a same number of byte-interleaved C1 codewords, the number being from two to eight byte-interleaved C1 codewords together.

According to some approaches, encoding may be performed in one of two ways. According to a first approach, in a first step, data portions of a data set are C2-encoded and then both data portions of the data set and C2-parity portions generated in the first step are C1-encoded. In a second approach, in a first step, data portions of the data set are C1-encoded and then both data portions of the data set and C1-parity portions generated in the first step are C2-encoded.

There are several advantages of using the embodiments described herein. Some advantages include improved data integrity without reducing the broken-track correction capability and the size of the data set buffer. Further benefits include on-the-fly ECC usage to improve data integrity. This due to the embodiments disclosed herein achieving additional improvements in data integrity by performing erasure-based iterations between C1 and C2 decoders, in contrast to conventional ECC schemes used in tape drives currently. The additional improvements in data integrity may be achieved on-the-fly or offline, i.e., in error recovery mode.

In addition, the RS (192,168,25) code is more powerful than the RS (96,84,13) code, which results in the same broken track performance as current formats and the same stripe error performance as current formats, but improved error performance in the case where some C1-interleaves are declared erasures while others are correctable, and improved error performance in the case of C1-decoder miscorrections.

Furthermore, the block-interleaved SDS format improves performance with iterative decoding between the C1 and C2 codes, while using erasure pointers for unsuccessfully decoded C1/C2-codewords, which allows it to be used in error-recovery mode. All of these advantages are possible with no increase of data set size.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system for encoding data, the system comprising:
logic adapted for receiving data comprising one or more sub data sets;
a C1 encoder module adapted for generating a plurality of C1 codewords during C1 error correction code (ECC) encoding of the one or more sub data sets, each of the C1 codewords comprising a plurality of symbols;
logic adapted for interleaving the plurality of C1 codewords into C1 codeword interleaves (CWIs), each CWI having a predetermined number of C1 codewords interleaved therein;
a C2 encoder module adapted for generating a plurality of C2 codewords during C2 ECC encoding of the one or more sub data sets, each of the C2 codewords comprising a plurality of symbols, wherein each C2 codeword has at most one symbol from each C1 codeword in each CWI, and wherein each C2 codeword has one symbol from at least two different C1 codewords in each CWI; and
logic adapted for writing the one or more encoded sub data sets to a storage medium.

2. The system as recited in claim 1, further comprising:
logic adapted for adding one or more headers to each of the one or more sub data sets; and
logic adapted for modifying the plurality of C1 codewords to account for inclusion of the one or more headers.

3. The system as recited in claim 1, wherein C2 ECC encoding is performed prior to C1 ECC encoding.

4. The system as recited in claim 1, wherein the logic adapted for interleaving the plurality of C1 codewords into the CWIs comprises logic adapted for byte-interleaving a same number of C1 codewords together into each CWI, the number ranging from two to eight C1 codewords.

5. The system as recited in claim 1, wherein the C1 ECC comprises a Reed-Solomon RS(240,230,11) code over Galois field GF(256), and wherein the C2 ECC comprises a RS(192,168,25) code over GF(256).

6. The system as recited in claim 1, wherein the storage medium is a magnetic tape, and wherein the system further comprises logic adapted for parsing the encoded data into a plurality of tracks prior to writing the encoded data to the magnetic tape.

7. A system for decoding sub data sets, the system comprising:
   logic adapted for receiving data comprising one or more encoded sub data sets, each encoded sub data set comprising C1 codeword interleaves (CWIs), each CWI having a predetermined number of C1 codewords interleaved therein;
   a C1 decoder module adapted for decoding a plurality of C1 codewords from each of the CWIs, each of the C1 codewords comprising a plurality of symbols;
   a C2 decoder module adapted for decoding a plurality of C2 codewords from the one or more encoded sub data sets, each of the C2 codewords comprising a plurality of symbols, wherein each C2 codeword has at most one symbol from each C1 codeword in each CWI, and wherein each C2 codeword has one symbol from at least two different C1 codewords in each CWI; and
   logic adapted for outputting the one or more decoded sub data sets.

8. The system as recited in claim 7, further comprising decoding one or more headers from each of the one or more encoded sub data sets.

9. The system as recited in claim 7, wherein the decoding of the plurality of C2 codewords is performed prior to the decoding of the plurality of C1 codewords.

10. The system as recited in claim 7, wherein each CWI comprises a same number of byte-interleaved C1 codewords, the number being from two to eight byte-interleaved C1 codewords together.

11. The system as recited in claim 7, wherein the decoding of the C1 codewords comprises decoding a Reed-Solomon RS(240,230,11) code over Galois field GF(256), and wherein the decoding of the C2 codewords comprises decoding a RS(192,168,25) code over GF(256).

12. The system as recited in claim 7, wherein the storage medium is a magnetic tape, and wherein the system further comprises logic adapted for combining encoded data from a plurality of tracks on the magnetic tape to produce the one or more encoded sub data sets.

13. A method for encoding sub data sets, the method comprising:
   receiving data comprising one or more sub data sets;
   generating a plurality of C1 codewords during C1 error correction code (ECC) encoding of the one or more sub data sets, each of the C1 codewords comprising a plurality of symbols;
   interleaving the plurality of C1 codewords into C1 codeword interleaves (CWIs), each CWI having a predetermined number of C1 codewords interleaved therein;
   generating a plurality of C2 codewords during C2 ECC encoding of the one or more sub data sets, each of the C2 codewords comprising a plurality of symbols, wherein each C2 codeword has at most one symbol from each C1 codeword in each CWI, and wherein each C2 codeword has one symbol from at least two different C1 codewords in each CWI; and
   writing the One or more encoded sub data sets to a storage medium.

14. The method as recited in claim 13, further comprising:
   adding one or more headers to each of the one or more sub data sets; and
   modifying the plurality of C1 codewords to account for inclusion of the one or more headers.

15. The method as recited in claim 13, wherein C2 FCC encoding is performed prior to C1 ECC encoding.

16. The method as recited in claim 13, wherein the interleaving the plurality of C1 codewords into the CWIs comprises byte-interleaving a same number of C1 codewords together into each CWI, the number ranging from two to eight C1 codewords.

17. The method as recited in claim 13, wherein the storage medium is a magnetic tape, and wherein the method further comprises parsing the encoded data into a plurality of tracks prior to writing the encoded data to the magnetic tape.

18. The method as recited in claim 13, wherein the C1 ECC comprises a Reed-Solomon RS(240,230,11) code over Galois field GF(256), and wherein the C2 FCC comprises a RS(192,168,25) code over GF(256).

19. A method for decoding sub data sets, the method comprising:
   receiving data comprising one or more encoded sub data sets, each encoded sub data set comprising C1 codeword interleaves (CWIs), each CWI having a predetermined number of C1 codewords interleaved therein;
   decoding a plurality of C1 codewords from each of the CWIs, each of the C codewords comprising a plurality of symbols;
   decoding a plurality of C2 codewords from the one or more encoded sub data sets, each of the C2 codewords comprising a plurality of symbols, wherein each C2 codeword has at most one symbol from each C1 codeword in each CWI, and wherein each C2 codeword has one symbol from at least two different C1 codewords in each CWI; and
   outputting the one or more decoded sub data sets.

20. The method as recited in claim 19, further comprising decoding one or more headers from each of the one or more encoded sub data sets.

21. The method as recited in claim 19, wherein the decoding of the plurality of C2 codewords is performed prior to the decoding of the plurality of C1 codewords.

22. The method as recited in claim 19, wherein each CWI comprises a same number of byte-interleaved C1 codewords, the number being from two to eight byte-interleaved C1 codewords together.

23. The method as recited in claim 19, wherein the decoding of the C1 codewords comprises decoding a Reed-Solomon RS(240,230,11) code over Galois field GF(256), and wherein the decoding of the C2 codewords comprises decoding a RS(192,168,25) code over GF(256).

24. The method as recited in claim 19, wherein the storage medium is a magnetic tape, and wherein the system further comprises logic adapted for combining encoded data from a plurality of tracks on the magnetic tape to produce the one or more encoded sub data sets.

* * * * *